(12) United States Patent
Zhang et al.

(10) Patent No.: US 7,071,019 B2
(45) Date of Patent: Jul. 4, 2006

(54) SYSTEM AND METHOD TO IMPROVE IMAGE SENSOR SENSITIVITY

(75) Inventors: Wei Zhang, Singapore (SG);
Chian-Liang Lin, Yunli (TW);
Jung-Chen Yang, Chu-Pei (TW);
Chia-Chun Hung, Taichung (TW);
Shih-Min Liu, Miaoli (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/944,243

(22) Filed: Sep. 16, 2004

(65) Prior Publication Data

US 2006/0057759 A1    Mar. 16, 2006

(51) Int. Cl.
*H01L 21/00* (2006.01)

(52) U.S. Cl. ............................................ 438/59
(58) Field of Classification Search ............... None
See application file for complete search history.

(56) References Cited

U.S. PATENT DOCUMENTS

| | | | |
|---|---|---|---|
| 6,218,210 B1 * | 4/2001 | Park ........................ 438/57 |
| 6,221,686 B1 * | 4/2001 | Drowley et al. ............... 438/57 |
| 6,506,619 B1 * | 1/2003 | Chen et al. .................... 438/48 |
| 6,514,785 B1 * | 2/2003 | Chiang et al. ................. 438/48 |
| 6,617,174 B1 * | 9/2003 | Rotstein ......................... 438/7 |
| 6,642,076 B1 * | 11/2003 | Yaung et al. .................. 438/48 |
| 6,841,411 B1 * | 1/2005 | Varghese ...................... 438/94 |
| 6,861,686 B1 * | 3/2005 | Lee et al. .................... 257/291 |
| 6,884,651 B1 * | 4/2005 | Toyoda et al. ................ 438/72 |
| 2002/0105585 A1 * | 8/2002 | Kimura ....................... 348/308 |
| 2004/0135065 A1 * | 7/2004 | Jang ......................... 250/208.1 |
| 2005/0017277 A1 * | 1/2005 | Rhodes ....................... 257/293 |
| 2005/0051701 A1 * | 3/2005 | Hong ....................... 250/214.1 |
| 2005/0064665 A1 * | 3/2005 | Han ............................. 438/286 |

\* cited by examiner

*Primary Examiner*—Chandra Chaudhari
(74) *Attorney, Agent, or Firm*—Duane Morris LLP

(57) ABSTRACT

A method is disclosed for forming at least one image sensor with improved sensitivity along with at least one transistor device. The method comprises forming at least a portion of the transistor device on a substrate, forming the image sensor by doping a predetermined area separated from the transistor device by a minimum predetermined distance, forming an etch stop layer for covering a contact area of the transistor device, removing at least a portion of the etch stop layer in the predetermined area for exposing the image sensor, and covering the image sensor and the transistor device by at least one transparent protection layer.

21 Claims, 2 Drawing Sheets

SYSTEM AND METHOD TO IMPROVE IMAGE SENSOR SENSITIVITY

BACKGROUND

The present invention relates generally to semiconductor integrated circuits, and more particularly, to a system and method to improve image sensor sensitivity of optical sensors in integrated circuit designs.

Semiconductor integrated circuits (ICs) are now produced that can have sensor functions as camera chips. For embodiment, the camera chip is mounted in the focal plane of a camera, and light image information is sensed and converted into electrical data for reconstructing the original image. Such a sensor IC is constructed in silicon, and has both logical and optical sensor functions. It is understood that silicon has a predictable light spectral response, which is different from that of the human eye. Silicon photoresponse is greatest in the red end of the visible light spectrum (with longer wavelengths), while the human photoresponse is greatest in the middle green part of the visible light spectrum. Silicon photoresponse shifts even further toward the red (i.e. towards longer wavelengths) with increasing depth of the photosensitive junction. In order to enhance the blue and green photoresponse of a silicon device, the diffused junction is typically very shallow, and very close to the surface.

The production of a complex, but practical, IC logic chip requires intricate multilevel metal interconnection structures. The integrated circuit must contain logic circuitry for control and for signal routing and decoding. The production of complex multilevel metal interconnections between the active surface of the logic portion of the IC and bond pads that connect to external circuits require via etches that are difficult to control precisely. For instance, a part of the complexity is a deep, high aspect ratio via etching through dielectric oxide layer. The precision of control of the etch depth of many vias placed across a large round silicon wafer is an important requirement. A production-worthy technique that achieves that precision is the imposition of an etch stop layer. To subsequently etch through the etch stop layer requires a different etchant. The material that is used for the etch stop layer is typically silicon-oxynitride (SiON).

However, SiON does not transmit all colors of the visible spectrum equally to the optical sensor portion of the IC. The spectral response of any silicon photodetector is therefore decayed by the presence of such a SiON etch stop layer. Conflicting requirements are presented for the production of a solid-state image sensor that can present a colored image that is suitable for the human eye.

Desirable in the art of solid-state image sensor designs are improved designs that improve spectral transmission even with an etch stop layer being deployed.

SUMMARY

In view of the foregoing, a method is disclosed that improves spectral transmission of semiconductor image sensors, when an etch stop layer is deployed.

In one embodiment, the method comprises forming at least a portion of the transistor device on a substrate, forming the image sensor by doping a predetermined area separated from the transistor device by a minimum predetermined distance, forming an etch stop layer for covering a contact area of the transistor device, removing at least a portion of the etch stop layer in the predetermined area for exposing the image sensor, and covering the image sensor, and the transistor device by at least one transparent protection layer.

The construction and method of operation of the invention, however, together with additional objects and advantages thereof will be best understood from the following description of specific embodiments when read in connection with the accompanying drawings.

DESCRIPTION

The present invention provides a method that improves spectral transmission of semiconductor image sensors, even when an etch stop layer is deployed.

Figure 1:
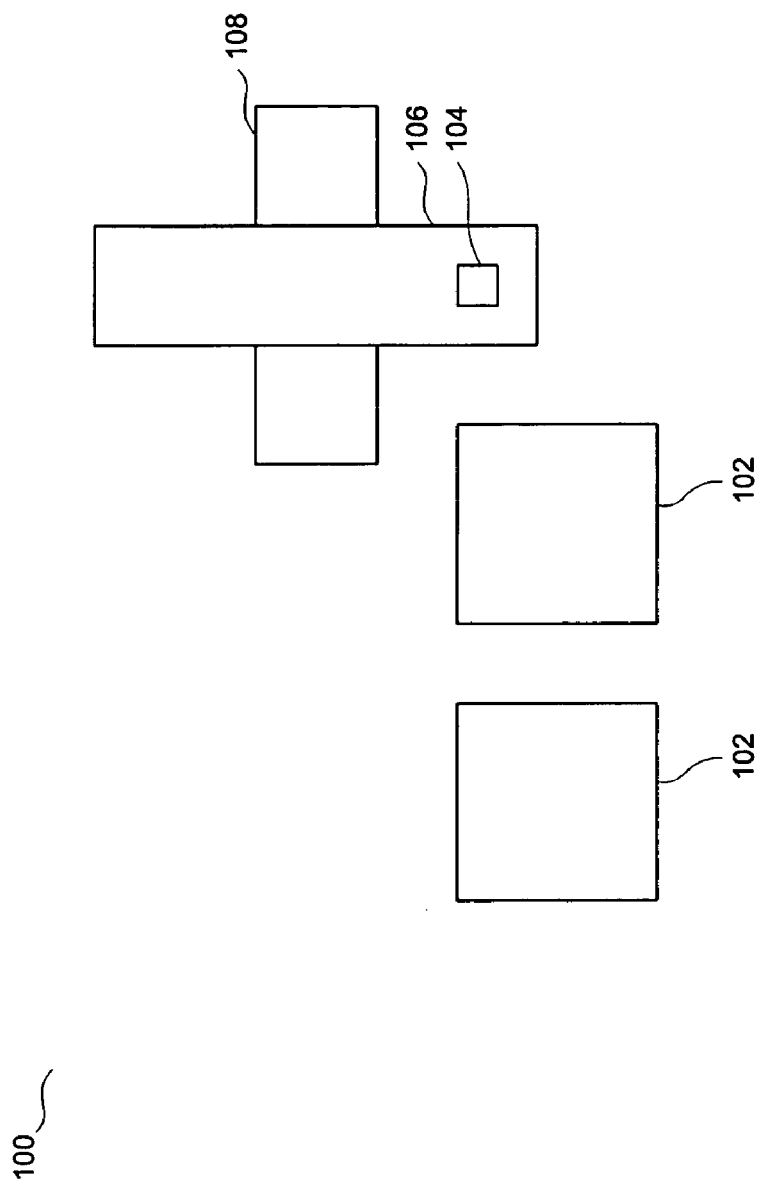
FIG. 1 is a schematic top-view layout for an image sensor and a transistor device in accordance with one embodiment of the present invention.

An element of a semiconductor integrated circuit (IC) chip that contains both an image sensor and logic circuitry is presented in a layout 100 in FIG. 1. A diffused area acts as a sensor or photodiode 102 (or phototransistor). The photo-generated electric carriers from the photodiode 102 are connected to a contact 104 of a poly gate 106 of a diffused output device 108, which may be a Metal-Oxide-Semiconductor Field-Effect-Transistor (MOSFET). As the carriers change the charge on, and by extension the voltage of, the poly gate 106, the output signal from the output device 108 changes in proportion to the light signal of an image element that is focused on the photodiode 102. A collection of such output signals from such output devices can be organized, externally, to recreate an image that was originally focused upon an array of such photodiodes 102.

The design rules for such a device requires that the minimum width of the photodiode 102 is about 0.44 um, and the minimum space between any two photodiodes is about 0.44 um as well. The direct distance from the edge of the photodiode to the active region (OD) of the output device 108 is about 0.2 um. Similarly, the direct minimum distance between the edges of the poly 106 and the photodiode 102 is about 0.2 um, with the minimum distance from the edge of the photodiode 102 to the edge of the contact 104 being about 0.2 um as well.

Figure 2:
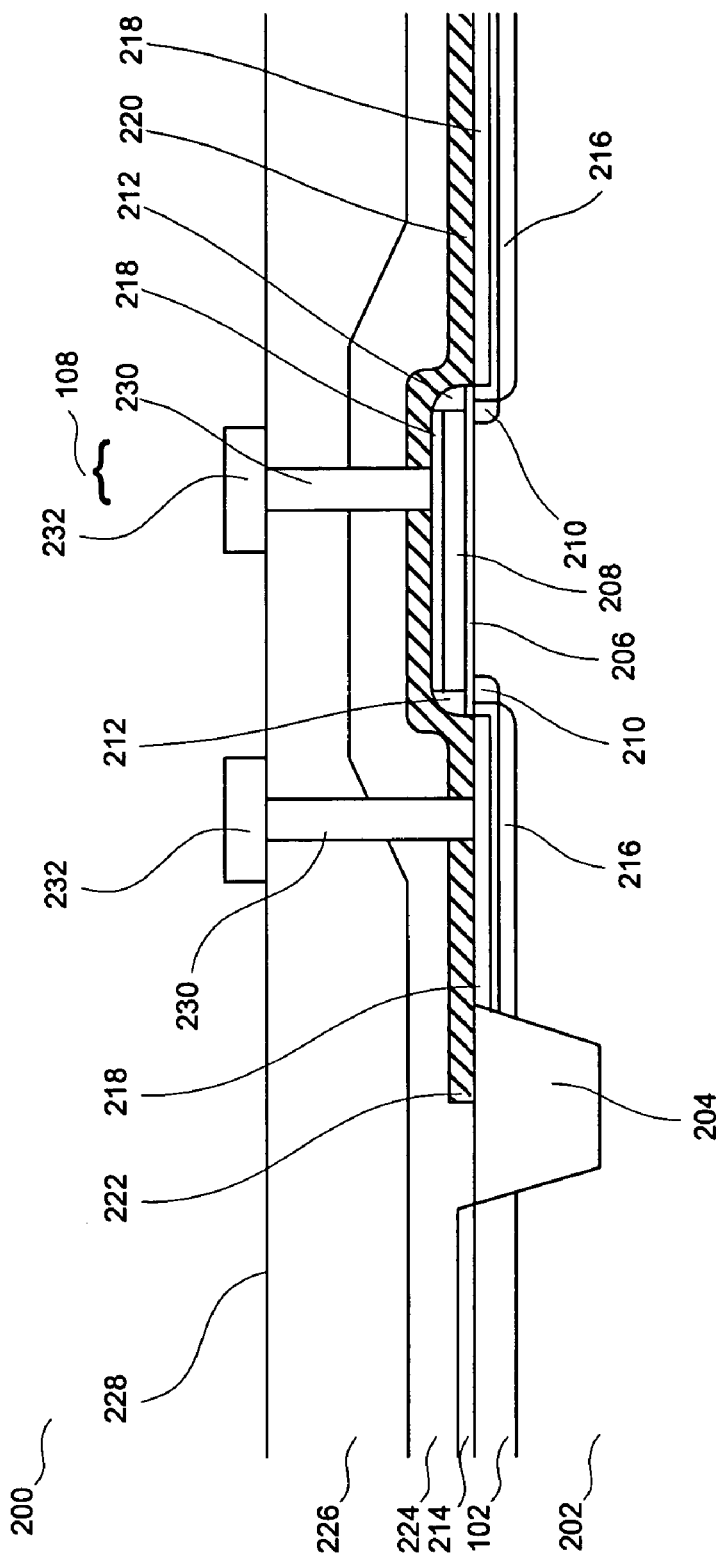
FIG. 2 illustrates a cross section of the image sensor and the transistor device in accordance with FIG. 1.

FIG. 2 presents a cross section 200 illustrating the structure of a photodiode 102 (or phototransistor) and an output device 108 in accordance with one embodiment of the present invention. A semiconductor substrate 202 contains a shallow trench isolation (STI) 204 structure. A gate structure is formed by forming a gate oxide 206 on the surface of the semiconductor substrate 202 and depositing a polysilicon layer to be etched to form a polysilicon gate 208 of a MOSFET, which is the diffused output device 108. Low doped drains (LDD) 210, (and source) doping are then implanted. Oxide is deposited and anisotropic etching defines sidewall spacers 212 on the polysilicon gate 208. An oxide 214 remains on non-contact areas, such as the area of the photodiode 102, to protect them from the metal to be deposited on all contacts. A plus doping 216 is implanted as self-aligned contact between the sidewall spacer 212 and the STI 204, for source and drain, for good contact to the LDD 210. Appropriate doping is implanted, and diffused to form the photodiode 102. Metal, in this case, cobalt, is deposited and alloyed to form a layer of cobalt silicide (CoSi) for the self-aligned contact area 218 between the sidewall spacer 212 and the STI 204, for source and drain, and also in the polysilicon gate 208. The excess metal is then etched off the oxide areas.

An etch stop layer 220 of silicon oxynitride (SiON) is deposited. This etch stop layer 220 will protect the contact areas from excess oxide etching later in the process.

However, since this is an optical device, the light transmission properties of the etch stop layer 220 must be considered in each area. With reference to FIG. 1, in the area of the output device 108, the quality of light transmission is irrelevant, but the etch stop function of the SiON is necessary. In the sensor area where the photodiode 102 resides, both light conversion efficiency and spectral response are important. The etch stop layer 220 interferes with light transmission, and therefore conversion efficiency, mostly in the red and blue light wavelengths. Therefore, it is economically worthwhile to create an extra photomask, which will enable the etch-removal of the etch stop layer 220 in the specific area for exposing the photodiode 102. A defined edge 222 of this photomask pattern is placed above the STI 204 band so that at least a substantial portion of the whole area of the photodiode 102, which may be bordered on the STI 204, is unshadowed by any of the etch stop layer 220. This structural feature allows light of an image to reach the photodiode 102 unimpeded by the optical properties of the etch stop layer 220. The specific benefit is a 20 percent increase in signal response to blue light, and a 5 percent increase in signal response to red light, with, conveniently, no change in signal response to green light. It is further understood that the opening of the sensor area is dependent on the size of the sensor. The opening may be smaller than the size of the sensor. If the opening is made unnecessarily large, and the CoSi contact area is exposed, corrosion of the contact area may happen, and it is not desirable.

The IC construction is continued in typical fashion. An undoped silicon glass (USG) 224 or other types of non-reactive transparent protection material, which prevents CoSi contamination, is deposited. This protection layer of USG 224 is important especially when the opening in the sensor area is relatively large for avoiding metal contamination. The thickness of this layer of USG can be about 200–700 angstroms. In addition, more than one layer of USG can be applied to avoid exposing the CoSi contact area. The USG layer 224 can be formed by applying, for embodiment, a TEOS process using SABP, followed by a borophospho-silicate glass (BPSG) flow at a high temperature such as 650 degrees Celsius for about half an hour, and further followed by a plasma-enhanced TEOS process.

A thick top glass layer 226 that is heavily doped with boron and phosphorus is deposited. To facilitate the metallization process that follows, a top surface 228 of the thick top glass layer 226 is planarized by chemical mechanical polish (CMP). After a photolithographic step, vias 230, for contacts, are etched through the thick top glass layers 226 and the undoped silicon glass 224 down to the CoSi 218 in the self-aligned contact between the sidewall spacer 212 and the STI 204, and also down to the CoSi 218 in the polysilicon gate 208. Conventional metallization procedures fill the vias 230 for forming an electrical connection. Deposited metal, layered over the metal-filled vias and the surface of the top glass, is patterned to form various metal line interconnections 232. Additional metal layers may be needed.

By removing the layer of etch stop layer that is over the optical sensor portion of the IC chip, while deploying the same layer of etch stop layer that is over the logic portion of the IC chip, improved spectral transmission may be achieved without affecting the precision of the production process.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific embodiments, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming at least one image sensor with improved sensitivity along with at least one transistor device, the method comprising:
    forming a gate structure of the transistor device;
    placing an oxide layer on the gate structure and simultaneously on top of a predetermined area for the image sensor separated from the transistor device by an isolation structure;
    forming the image sensor by doping the predetermined area;
    forming at least one contact area;
    forming an etch stop layer for covering the contact area;
    removing at least a portion of the etch stop layer in the predetermined area for exposing the image sensor; and
    covering the image sensor and the transistor device by at least one transparent protection layer.

2. The method of claim 1 further comprising covering the protection layer by a top glass layer with a planarized surface.

3. The method of claim 1 further comprising forming an electrical connection to the contact area through the transparent protection layer and the etch stop layer.

4. The method of claim 1 wherein the etch stop layer includes SiON.

5. The method of claim 1 wherein the isolation area is a shallow trench isolation structure.

6. The method of claim 1 wherein the contact area contains CoSi.

7. The method of claim 1 wherein the protection layer has a thickness of at least about 200 angstroms.

8. The method of claim 1 wherein the protection layer has a thickness of less than about 700 angstroms.

9. The method of claim 1 wherein the protection layer is an undoped silicon glass.

10. A method for forming at least one image sensor with improved sensitivity along with at least one transistor device, the method comprising:
    forming at least a portion of the transistor device on a substrate;
    forming the image sensor by doping a predetermined area separated from the transistor device by a minimum predetermined distance;
    forming an etch stop layer for covering a contact area of the transistor device;
    removing at least a portion of the etch stop layer in the predetermined area for exposing the image sensor; and covering the image sensor and the transistor device by at least one transparent protection layer.

11. The method of claim 10 further comprising covering the protection layer by a top glass layer with a planarized surface.

12. The method of claim 10 wherein the image sensor and the transistor device are separated by a shallow trench isolation structure.

13. The method of claim 10 wherein the etch stop layer includes SiON.

14. The method of claim 13 wherein the contact area contains CoSi.

15. The method of claim 10 wherein the protection layer has a thickness of at least about 200 angstroms.

16. The method of claim 15 wherein the protection layer has a thickness of less than about 700 angstroms.

17. The method of claim 10 wherein the protection layer is an undoped silicon glass.

18. A method for forming at least one image sensor with improved sensitivity along with at least one transistor device, the method comprising:

forming at least a portion of the transistor device on a substrate;

forming the image sensor by doping a predetermined area separated from the transistor device by an shallow trench isolation structure;

forming a SiON containing etch stop layer for covering a contact area of the transistor device;

removing at least a portion of the etch stop layer in the predetermined area for exposing the image sensor; and covering the image sensor and the transistor device by at least one undoped silicon glass layer with a thickness of at least about 200 angstroms.

19. The method of claim 18 further comprising covering the protection layer by a top glass layer with a planarized surface.

20. The method of claim 18 wherein the contact area contains CoSi.

21. The method of claim 18 wherein the protection layer has a thickness of less than about 700 angstroms.

* * * * *